(12) United States Patent
Kishi et al.

(10) Patent No.: US 8,142,565 B2
(45) Date of Patent: Mar. 27, 2012

(54) VITREOUS SILICA CRUCIBLE FOR PULLING SINGLE-CRYSTAL SILICON

(75) Inventors: Hiroshi Kishi, Akita (JP); Minoru Kanda, Akita (JP)

(73) Assignee: Japan Super Quartz Corporation, Akita-Shi (JP)

( * ) Notice: Subject to any disclaimer, the term of this patent is extended or adjusted under 35 U.S.C. 154(b) by 529 days.

(21) Appl. No.: 12/325,033

(22) Filed: Nov. 28, 2008

(65) Prior Publication Data

US 2009/0165701 A1 Jul. 2, 2009

(30) Foreign Application Priority Data

Dec. 28, 2007 (JP) ................ P2007-339345

(51) Int. Cl.
*C30B 15/10* (2006.01)
*C30B 15/00* (2006.01)
(52) U.S. Cl. ........... 117/13; 117/20; 117/208; 117/213; 117/900
(58) Field of Classification Search ............... 117/13, 117/20, 208, 213, 900
See application file for complete search history.

(56) References Cited

U.S. PATENT DOCUMENTS

| | | | |
|---|---|---|---|
| 2006/0191294 A1* | 8/2006 | Ganz et al. .............. | 65/404 |
| 2006/0236916 A1 | 10/2006 | Ohama | |
| 2009/0145351 A1* | 6/2009 | Kishi et al. .............. | 117/208 |
| 2009/0165701 A1* | 7/2009 | Kishi et al. .............. | 117/13 |
| 2009/0272315 A1* | 11/2009 | Fukui et al. .............. | 117/208 |

FOREIGN PATENT DOCUMENTS

| | | | |
|---|---|---|---|
| JP | 03-208880 | | 9/1991 |
| JP | 2005-67910 | | 3/2005 |
| JP | 2005-343774 | | 12/2005 |
| JP | 2005330157 | * | 12/2005 |
| JP | 2007091562 | * | 4/2007 |
| WO | 2004/097080 | | 11/2004 |

OTHER PUBLICATIONS

English language Abstract of JP2005-67910, Mar. 17, 2008.
U.S. Appl. No. 12/324,978, filed on Nov. 28, 2008.

* cited by examiner

*Primary Examiner* — Karl Group
(74) *Attorney, Agent, or Firm* — Greenblum & Bernstein, P.L.C.

(57) ABSTRACT

A vitreous silica crucible for pulling single-crystal silicon, which is formed of vitreous silica and has a bottomed cylindrical shape, wherein, in a liquid-level movement range in the inner surface of the crucible, ranging from a position corresponding to the liquid surface level of a silicon melt at the time of stating the pulling of single-crystal silicon to a position corresponding to the liquid surface level of a silicon melt at the time of finishing the pulling of single-crystal silicon, the concentration of an OH group included in the vitreous silica is higher in an erosion thickness portion of the inner surface of the crucible than that in the range lower than the liquid surface level which is positioned below the liquid-level movement range.

5 Claims, 3 Drawing Sheets

VITREOUS SILICA CRUCIBLE FOR PULLING SINGLE-CRYSTAL SILICON

BACKGROUND OF THE INVENTION

1. Field of the Invention

The present invention relates to a vitreous silica crucible which is used for pulling single-crystal silicon, and more particularly, a vitreous silica crucible which is suitable for repeatedly pulling several times (multi-pulling) and is capable of suppressing erosion of the inner surface of the crucible at the time of pulling such that brown rings and the like are unlikely to be peeled from the inner surface of the crucible.

Priority is claimed on Japanese Patent Application No. 2007-339345, filed Dec. 28, 2007, the content of which is incorporated herein by reference.

2. Description of the Related Art

The pulling of single-crystal silicon is generally performed by the Czochralski method (CZ method) for pulling single-crystal silicon from a silicon melt fed into a vitreous silica crucible. In a process of pulling single-crystal silicon by the CZ method, as shown in FIG. 5, in an upper end of a portion in which a liquid level D of a silicon melt B in the vitreous silica crucible A is in contact with the inner surface of the crucible, an upper edge E of the liquid level D is in contact with the inner surface of the crucible in a state of slightly rising along the inner surface of the crucible A due to the surface tension of the silicon melt B. The rising portion of the liquid level D of the silicon melt is a three-phase interface portion E (meniscus portion) in which the glass surface of the crucible A, the silicon melt B and atmosphere gas C are adjacent to one another.

Generally, the inner surface of the crucible A which is in contact with the silicon melt B is eroded by reaction with the silicon melt B such that SiO is generated. Since the silicon melt B is thin in the three-phase interface portion E, the generated SiO is susceptible to be discharged to the atmosphere gas C. Accordingly, the three-phase interface portion E is eroded faster than that of the portion in which the inner surface of the crucible and the silicon melt B are in contact with each other at the lower portion of the liquid level D.

Since the inner surface of the crucible is susceptible to be eroded in the three-phase interface portion E, the concentration of the oxygen in a solution in the three-phase interface portion E becomes higher than other portions. Accordingly, if the volume of the three-phase interface portion E is large, the amount of oxygen introduced into the silicon melt is increased. Accordingly, the present applicant suggests a vitreous silica crucible capable of suppressing the amount of oxygen introduced into a silicon melt by increasing a contact angle between the liquid level of the silicon melt and the inner surface of a crucible and decreasing the volume of a three-phase interface portion (JP-A No. 2005-67910).

However, recently, in order to improve pulling efficiency of single-crystal silicon, a multi-pulling method of pulling the single-crystal silicon using a crucible a plurality of times is performed. In this method, a silicon melt is repeatedly charged in the crucible and the single-crystal silicon is pulled a plurality of times. In this pulling method, since the level of the silicon melt is vertically moved on the inner surface of the crucible according to the number of times of pulling and the three-phase interface portion is repeatedly moved on the inner surface of the crucible, the erosion amount of the inner surface of the crucible is increased although the total pulling amount is the same, compared with a method of pulling a long single-crystal silicon using one crucible.

Since the pulling is performed at a high temperature, brown rings (ring-shaped crystallization portions) which occur due to the reaction of vitreous silica and silicon or spots which occur due to the crystallization of the vitreous silica exist on the inner surface of the crucible at the time of pulling. If the three-phase interface portion of the liquid level of the silicon melt passes through the portion in which the brown rings or the crystal spots exist, the brown rings or the crystal spots are susceptible to be peeled from the inner surface of the crucible by the erosion of the inner surface of the crucible. If the brown rings or the crystal spots are peeled and mixed into the silicon melt, the yield of the single crystallization deteriorates.

The present invention provides a vitreous silica crucible and a vitreous silica crucible suitable for multi-pulling, in which brown rings or crystal spots are unlikely to be peeled from the inner surface of the crucible although a three-phase interface portion of a liquid level of a silicon melt is repeatedly moved along the inner surface of the crucible.

SUMMARY OF THE INVENTION

The present invention relates to a vitreous silica crucible for pulling single-crystal silicon, which solves the above-described problems by the configurations of the following [1] to [4].

[1] A vitreous silica crucible for pulling single-crystal silicon, which is formed of vitreous silica and has a bottomed cylindrical shape, wherein, in a liquid-level movement range in the inner surface of the crucible, ranging from a position corresponding to the liquid surface level of a silicon melt at the time of starting the pulling of single-crystal silicon to a position corresponding to the liquid surface level of a silicon melt at the time of finishing the pulling of single-crystal silicon, the concentration of an OH group included in the vitreous silica is higher in an erosion thickness portion of the inner surface of the crucible than that in the range lower than the liquid surface level which is positioned below the liquid-level movement range.

[2] The vitreous silica crucible according to [1], wherein, with respect to the concentration of an OH group included in the erosion thickness portion of the inner surface of the crucible, the OH group concentration in a curved portion of the crucible is higher than that in a bottom of the crucible, and the OH group concentration in a wall portion of the crucible is higher than that in the curved portion of the crucible.

[3] The vitreous silica crucible according to [1] or [2], wherein the concentration of an OH group included in the erosion thickness portion of the inner surface of the crucible is 40 to 120 ppm in the bottom of the crucible, is 50 to 140 ppm in the curved portion of the crucible, and is 60 to 150 ppm in the wall portion of the crucible; the concentration of an OH group in the curved portion of the crucible is higher than that in the bottom of the crucible by 10 to 50 ppm, and the concentration of an OH group in the wall portion of the crucible is higher than that in the curved portion of the crucible by 10 to 30 ppm; and the thickness of the erosion thickness portion in which the OH group concentration is controlled is 15% or less of the thickness of the crucible of a portion corresponding thereto.

[4] The vitreous silica crucible according to any one of [1] to [3], wherein the erosion thickness portion of the inner surface of the crucible is a transparent layer portion having a thickness of 1 mm from the inner surface of the crucible.

In the vitreous silica crucible according to an aspect of the present invention, in the inner surface of the crucible, within the liquid-level movement range from the position corresponding to the liquid surface level of a silicon melt at the time of starting the pulling-up of single-crystal silicon at an atmospheric temperature to a pulling-up temperature ranging from 1,400° C. to 1,550° C. to the position corresponding to the liquid surface level of a silicon melt at the time of finishing the pulling-up of single-crystal silicon, the concentration of an OH group included in the vitreous silica is higher in the erosion thickness portion of the inner surface of the crucible than that in the range lower than the liquid surface level which is positioned below the liquid-level movement range. Accordingly, since the concentration of an OH group in the liquid-level movement range is high, silicon dioxide of the inner surface of the crucible is susceptible to be crystallized compared with the range lower than the liquid surface level, and erosion hardly occurs although being in contact with the silicon melt by crystallization. Accordingly, even when a three-phase interface portion formed in the edge of a liquid surface level of the silicon melt is repeatedly moved up and down along the liquid-level movement range, peeling of brown rings or crystal spots generated in the liquid-level movement range hardly occurs. Accordingly, even in the multi pulling of performing pulling-up of single-crystal silicon several times in the same crucible, it is possible to suppress deterioration of the quality of the single crystal due to the mixing of the brown rings or crystal spots into the silicon melt.

If the concentration of an OH group in the crucible curved portion is higher than that in a bottom of the crucible and the concentration of an OH group in the crucible wall portion is higher than that in the crucible curved portion, crystallization progresses quickly in the inner surface of the crucible wall portion and the crystallization is suppressed in the inner surface of the crucible curved portion compared with the crucible wall portion. Moreover, crystallization is suppressed in the inner surface of the bottom of the crucible. Accordingly, even when the liquid level of the silicon melt is repeatedly moved up and down along the crucible wall portion in the multi-pulling and the liquid level of the silicon melt partially falls to the crucible curved portion, it is possible to suppress the peeling of the brown rings or the crystal spots in correspondence to the frequency thereof and increase the crystallization ratio of the single-crystal silicon.

If the concentration of an OH group included in the erosion thickness portion of the inner surface of the crucible is 40 to 120 ppm in the crucible bottom, is 50 to 140 ppm in the crucible curved portion and is 60 to 150 ppm in the crucible wall portion, the concentration of an OH group of the crucible curved portion is higher than that in the crucible bottom by 10 to 50 ppm, and the concentration of an OH group in the crucible wall portion is higher than that in the crucible curved portion by 10 to 30 ppm, it is possible to sufficiently maintain the vitreous silica strength at a high temperature with respect to portions reaching from the crucible bottom to the crucible wall portion and prevent deformation of the crucible at the time of pulling-up.

In addition, if the thickness of the erosion thickness portion in which the concentration of an OH group is adjusted is 15% or less of the thickness of the crucible of a portion corresponding thereto, balance with the strength of the crucible is suitable, the adjustment of the concentration of an OH group is readily performed, and the vitreous silica crucible suitable for the multi-pulling can be obtained. The erosion thickness portion may be a transparent layer portion having a thickness of 1 mm from the inner surface of the crucible.

DETAILED DESCRIPTION OF THE INVENTION

Hereinafter, the embodiment of the present invention will be described in detail.

Figure 1:
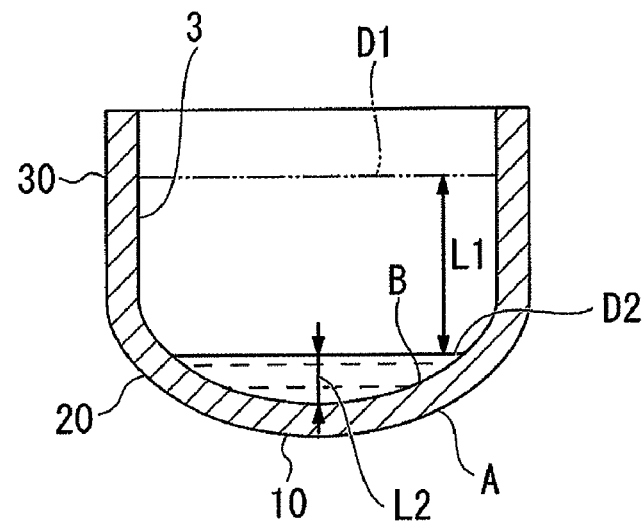
FIG. 1 is a longitudinal cross-sectional view showing an embodiment of a vitreous silica crucible for pulling-up single-crystal silicon according to the present invention, which shows a state in which a silicon melt remains on a bottom of a crucible.

FIG. 1 is a longitudinal cross-sectional view showing an embodiment of a vitreous silica crucible for pulling-up single-crystal silicon according to the present invention. The vitreous silica crucible A is formed of vitreous silica and has a bottomed cylindrical shape as a whole. A crucible A has a cylindrical crucible wall portion 30, a crucible bottom 10 which closes a lower end of the crucible wall portion 30 and forms a convex surface at the lower surfaces, and a crucible curved portion 20 connected between the crucible bottom and the crucible wall portion.

Figure 2:
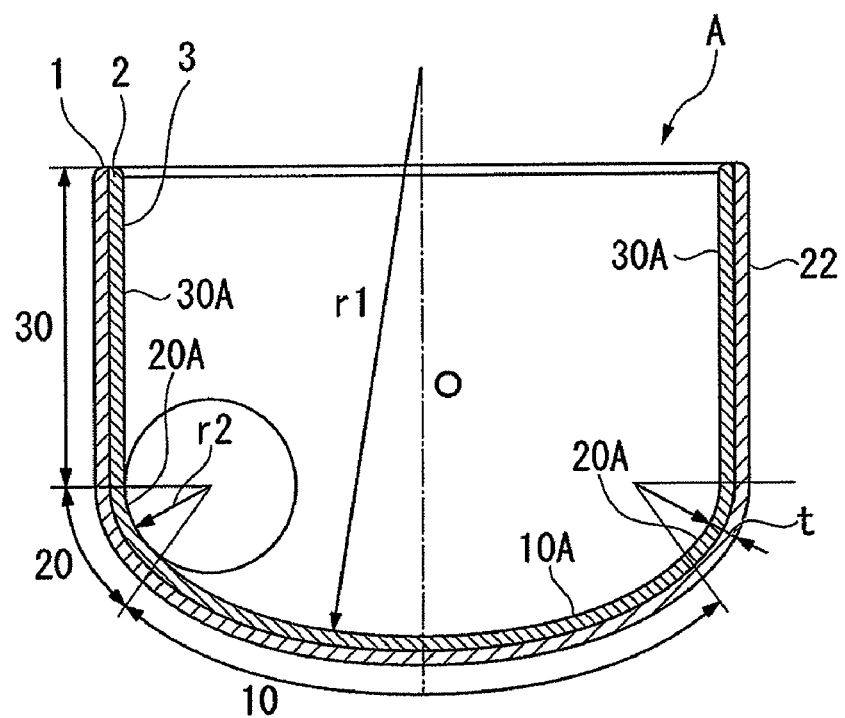
FIG. 2 is a longitudinal cross-sectional view showing the embodiment in more detail.

As shown in FIG. 2, the crucible wall portion 30 is a cylindrical portion having a crucible axis line O and the longitudinal cross-section thereof has a straight line shape The crucible curved portion 20 is a portion from the lower end of a straight barrel portion 12 to a bottom 13.

As shown in FIG. 1, in the inner surface of the crucible A, a range from a position corresponding to the liquid surface level of a silicon melt D1 at the time of starting the pulling-up of the single-crystal silicon to a position corresponding to the liquid surface level of a silicon melt D2 at the time of finishing the pulling-up of the single-crystal silicon is a liquid-level movement range L1. In the inner surface of the crucible A, a place positioned below the liquid-level movement range L1 is called a liquid level lower range L2. In this definition, this crucible A is characterized in that, in the liquid-level movement range L1, the concentration of an OH group included in the vitreous silica of an erosion thickness portion 3 of the inner surface of the crucible is higher than that of the liquid level lower range L2. The erosion thickness portion 3 indicates a portion which can be lightly melted due to the reaction with the silicon melt D when the silicon melt D is filled in the crucible A and, in the present specification, indicates a constant thickness range in the whole inner surface of the crucible A. The constant thickness is changed according to the materials and the sizes of the crucible, but is preferably from 0.5% to 15% of the thickness of the crucible and more preferably from 1% to 10% of the thickness of the crucible. More generally, the thickness of the erosion thickness portion 3 is 0.2 mm to 1 mm.

In the crucible A of this embodiment, in association with the concentration of an OH group included in the erosion thickness portion 3 of the inner surface of the crucible, the concentration of an OH group of inner surface 20A of the curved portion is higher than that of the inner surface 10A of the bottom, and the concentration of an OH group of inner surface 30A of the wall portion is higher than that of the OH group of the inner surface 20A of the curved portion. That is, the concentration of an OH group is increased in three stages from the lower side.

As shown in FIG. 2, the crucible A of this embodiment may be entirely formed of an outer layer 1 and an inner layer 2. In this case, the inner layer 2 which is in contact with the silicon melt is formed of a transparent glass layer having a low impurity content. The transparent glass layer 2 generates SiO by the contact with the silicon melt B under high temperature at the time of the pulling-up, and SiO is soluble in the silicon melt B such that the inner surface is slightly eroded. The outer layer 1 is an outer bubble layer including minute bubbles. In a general number of times of pulling-up, the erosion thickness of the inner layer 2 is generally less than 1 mm from the inner surface of the crucible. Although, in this embodiment, the crucible is formed of the outer layer 1 and the inner layer 2, the crucible A may be formed of a single layer.

If the inner surface of the crucible A is brought into contact with the silicon melt having a high temperature, glass is locally crystallized at the time of pulling-up and annular spots called brown rings are generated. Since the central portions of the brown rings are thinner than the edges thereof, if the inner surface of the crucible including the brown rings is eroded, the central portions of the brown rings are exposed and partial peeling is susceptible to occur.

The vitreous silica crucible is formed by melting and vitrifying quartz powder in the shape of the crucible. Since the quartz power as a raw material includes $SiO_2$ as a major component and a small amount of OH groups, the glass layer of the crucible includes a small amount of OH groups. If the concentration of an OH group is high, the viscosity of the glass deteriorates and the OH group is inserted into the chain of the glass structure. Accordingly, the glass structure is apt to be cut or crystallized. In particular, in synthetic fused silica powder obtained by a sol-gel method, silanol generated by hydrolysis of alkoxide generally remains at 50 ppm to several hundred ppm. By preparing the inner layer 2 of the vitreous silica crucible using the synthetic fused silica powder containing silanol, the concentration of an OH group of the inner layer 2 can be adjusted.

In the vitreous silica crucible of the present invention, in the inner surface of the crucible, the liquid-level movement range from the position corresponding to the liquid surface level of a silicon melt at the time of starting the pulling-up of the single crystal to the position corresponding to the liquid surface level of a silicon melt at the time of finishing the pulling-up of the single-crystal silicon, the concentration of an OH group included in the vitreous silica of the erosion thickness portion of the inner surface of the crucible is higher than that in the range lower than the liquid surface level which is positioned below the liquid-level movement range. Accordingly, the vitreous silica is apt to be crystallized in the inner surface of the crucible of the liquid level movement range and thus the elution of SiO into the silicon melt is suppressed. Thus, the erosion of the inner surface of the inner layer 2 is suppressed. Accordingly, although the multi-pulling is performed such that the liquid level of the silicon melt repeatedly passes through the liquid-level movement range, the erosion of the liquid-level movement range is suppressed and thus the brown rings are unlikely to be peeled. Therefore, the peeled brown rings are unlikely to prevent the growth of the single-crystal silicon.

Figure 3:
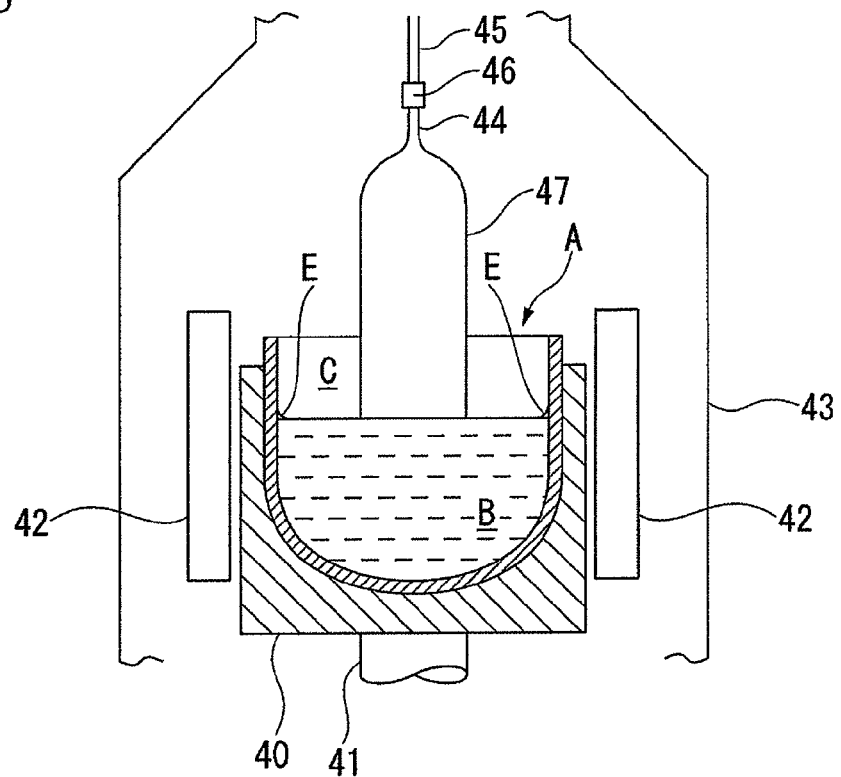
FIG. 3 is a longitudinal cross-sectional view showing a process of pulling-up single-crystal silicon using the embodiment.

Generally, the pulling-up of the single-crystal silicon is, as shown in FIG. 3, performed by feeding a polycrystal silicon block into the crucible A, heating and melting the polycrystal silicon block so as to form the silicon melt B, pulling-up the single-crystal silicon 47 from the silicon melt B, and stopping the pulling-up in a state in which the silicon melt remains in the crucible bottom 10. As shown in FIG. 2, since the silicon melt B after the pulling-up of the single crystal remains from the curved portion 20 of the crucible A in the range of the bottom 10, the contact frequency between the three-phase interface portion (meniscus portion) E of the silicon melt D and the inner surface of the crucible is high in the crucible wall portion 30, is higher in the crucible curved portion 20, and is minimized in the crucible bottom 10. In correspondence with the contact frequency, the concentration of an OH group of the crucible curved portion 20 is higher than that in the crucible bottom 10 and the concentration of an OH group of the crucible wall portion 30 is higher than that of the OH group of the crucible curved portion 20.

For example, the radius of curvature of the inner surface of the 32-inch vitreous silica crucible is 140 to 180 mm in the central portion of the curved portion and is 780 to 840 mm in the central portion of the bottom, and the radius of curvature in the boundary between the curved portion and the bottom is about 0 mm.

In this embodiment, it is preferable that the concentration of an OH group of the bottom 10 be 40 to 120 ppm, the concentration of an OH group of the curved portion 20 be 50 to 140 ppm, and the concentration of an OH group of the wall portion 30 be 60 to 150 ppm. The concentration of an OH group indicates the concentration of an OH group of the thickness-direction average of the erosion thickness portion 3 of the inner surface of the crucible A.

In addition, it is preferable that the concentration of an OH group of the curved portion be higher than that of the OH group of the bottom by 10 to 50 ppm and the concentration of an OH group of the wall portion be higher than that of the OH group of the curved portion by 10 to 30 ppm.

As a method of measuring the concentration of an OH group, IR spectroscopy may be used. In more detail, the concentration of an OH group is determined by the absorbing spectrum of an OH group at 3672 nm which is the sample infrared light.

More preferably, it is preferable that the concentration of an OH group in the bottom be 45 to 80 ppm, the concentration of an OH group in the curved portion be 50 to 90 ppm, and the concentration of an OH group in the wall portion be 60 to 120 ppm. It is preferable that the concentration of an OH group in the curved portion be higher than that in the bottom by 10 to 20 ppm and the concentration of an OH group of the wall portion be higher than that in the curved portion by 10 to 20 ppm.

For example, in the vitreous silica crucible of Embodiment 1 described below, the concentration of an OH group in the bottom was 90 ppm, the concentration of an OH group in the curved portion was 134 ppm which is higher by 44 ppm, and the concentration of an OH group in the wall portion was 148 ppm, which is higher by 14 ppm. In the vitreous silica crucible of Embodiment 2, the concentrations of the OH groups in the bottom, the curved portion and the wall portion are each increased by 20 ppm.

In order to adjust the concentration of an OH group of the erosion thickness portion 3 of each portion of the crucible A, the following method may be used. The vitreous silica crucible is obtained by laminating vitreous silica powder along the inner wall surface of a mold made of carbon, producing arc discharge among a plurality of carbon electrodes arranged in the central portion of the mold, melting the quartz powder, and integrally forming the outer layer 1 and the inner layer 2.

Generally, naturalquartz, which is the material of the outer layer 1, is laminated on the inner circumferential surface of the mold at a predetermined thickness and synthetic fused silica powder, which is the material of the inner layer 2, is deposited thereon at a predetermined thickness.

At this time, plural types of silica glass raw materials having different OH concentrations are arranged on portions forming the inner layer 2 of the crucible and are heated, melted and vitrified. In the synthetic fused silica powder obtained by a sol-gel method, silanol generated by hydrolysis of alkoxide generally remains by 50 ppm to several hundred ppm, and the concentration of the silanol group is changed according to manufacturing conditions. Therefore, the material in which the concentration of an OH group is high is mainly used for forming the inner surface 2 of the crucible wall portion 30, the material in which the concentration of an OH group is intermediate is used for forming the inner layer 2 of the crucible curved portion 20, and the material in which the concentration of an OH group is low is used for forming the inner layer 2 of the crucible bottom 10, such that the crucible A having a different concentration of the OH group of the inner layer 2 in three stages can be manufactured. In the boundary of the inner layers 2 of the crucible bottom 10, the crucible curved portion 20 and the crucible wall portion 30, it is preferable that the raw material powders be mixed in a range of 10 to 50 mm along the longitudinal cross section such that the concentration of an OH group be slowly changed. When the inner layer 2 of the vitreous silica crucible is prepared using a plurality of synthetic fused silica powders containing silanol at different concentrations, it is possible to adjust the concentration of an OH group of the inner layer 2.

As another method of adjusting the concentration of an OH group, a crucible A in which the concentration of an OH group of the inner layer 2 is changed in three stages can be manufactured by rising and falling arc generated by a discharge electrode or eccentrically disposing or sloping arc with respect to a mold axis when the quartz powder deposited in the mold is heated and melted by the arc discharge, increasing the heating degree in order of the inner layer 2 of the crucible wall portion 30, the inner layer 2 of the crucible curved portion 20 and the inner layer 2 of the crucible bottom 10, and partially adjusting the degree to which silanol in the synthetic silica glass powder is removed. The stronger the heating degree of the synthetic fused silica powder, the more silanol is removed. Thus, the concentration of an OH group is decreased. In this case, only the same type of synthetic fused silica powder may be used, or plural types of synthetic fused silica powders having different silanol concentrations may be arranged in the combination of the above-described method such that the heating degree is adjusted. The synthetic fused silica powder in which the silanol concentration is adjusted may not be formed on the entire range of the inner layer 2, and the synthetic fused silica powder in which the silanol concentration is adjusted may be formed in only a region corresponding to the thickness of the erosion thickness portion 3 in the inner layer 2.

The outer layer 1 may be formed such that the concentration of an OH group thereof is smaller than that of the inner layer 2 of the crucible bottom 10 using natural silica glass powder having a low silanol group content. Since the outer layer 1 is farther from the arc discharge than the inner layer 2 and is in the contact with the mold, bubbles are not completely excluded and vitrification is realized in a state where the minute bubbles remain. Accordingly, the outer layer 1 becomes translucent.

Since the thickness of the erosion thickness portion 3 of the inner surface of the crucible is generally less than 1 mm, the concentration of an OH group of the crucible bottom 10, the crucible curved portion 20 and the crucible wall portion 30 are adjusted as described above with respect to the concentration of an OH group included in a portion corresponding to a thickness of 1 mm from the inner surface of the crucible. The thickness of the erosion thickness portion 3, that is, the OH group concentration adjustment portion, is 15% or less of the thickness of the crucible. It is not preferable that the thickness of the erosion thickness portion 3 be larger than 15% of the thickness of the crucible. If erosion occurs by 15% or more of the thickness of the crucible, the deterioration of the strength of the crucible is increased.

If the single-crystal silicon is pulled by the vitreous silica crucible of the present embodiment, the pulling device shown in FIG. 3 is used. The crucible A is coaxially supported to a susceptor 40 made of graphite and the susceptor 40 rises/falls and rotates via a shaft 41. An induction heater 42 is rotation-symmetrically arranged on the outside of the susceptor 40 in the axis line of the crucible. All these components are disposed in a chamber 43.

When the single-crystal silicon is pulled, first, a polycrystal silicon raw material is charged in the crucible A, the crucible A is heated by the heater 42 and the silicon melt D is generated. The atmosphere gas in the chamber 43 is suitably adjusted. Next, a silicon seed crystal 44 is immersed in the silicon melt D using a hanging wire 45 and a seed fixing clamp 46, a neck portion is formed and a columnar single crystal 47 is grown from the silicon melt D.

Figure 4:
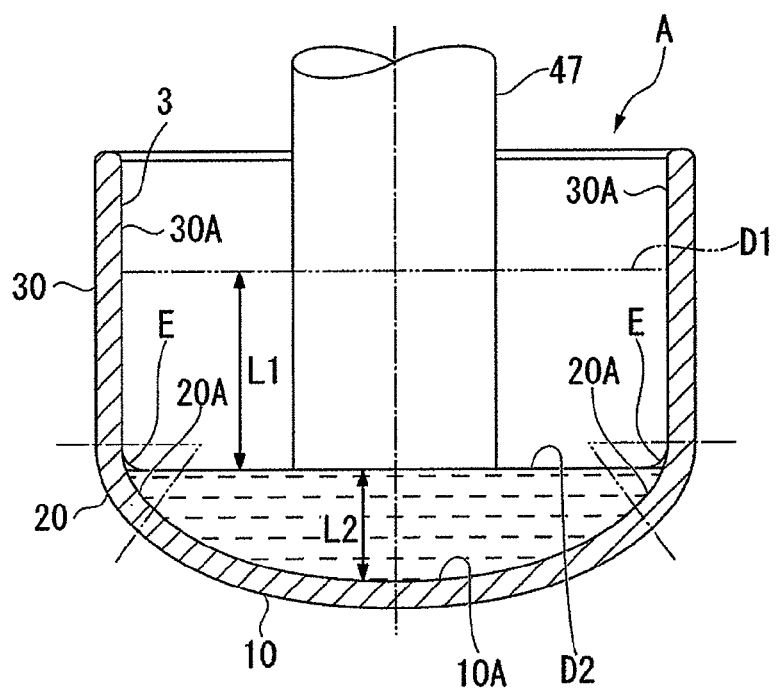
FIG. 4 is a longitudinal cross-sectional view showing a state in which the liquid level of a silicon melt drops in the process of pulling-up the single-crystal silicon.
Figure 5:
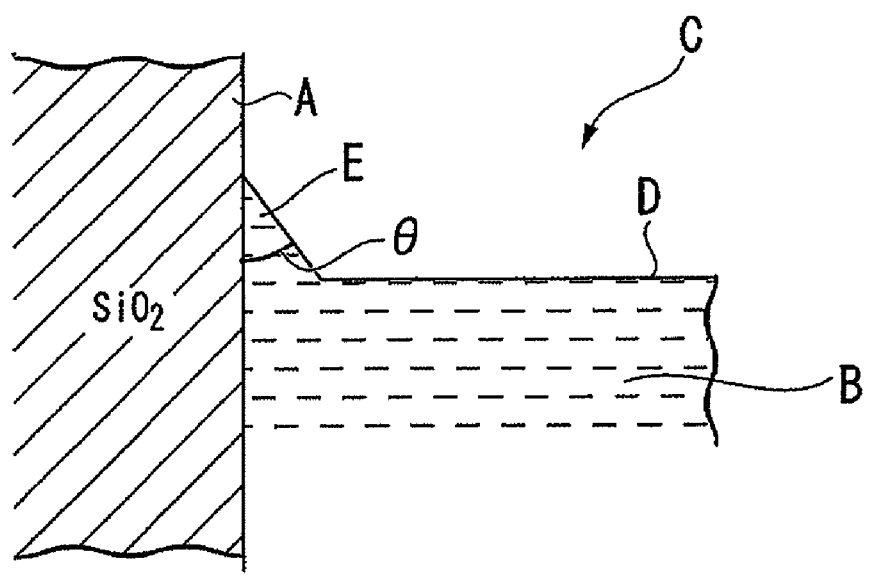
FIG. 5 is an enlarged cross-sectional view showing a three-phase interface portion (meniscus portion) which occurs at a location where the surface of the silicon melt is in contact with the inner wall surface of the crucible.

As shown in FIG. 4, if the silicon melt D is decreased from the liquid level D1 immediately after the start of the pulling-up to the liquid level D2 at the time of finishing the pulling-up, the single crystal 47 is eliminated, the silicon melt D is generated in the crucible A again, the silicon seed crystal 44 is immersed in the silicon melt D again, the neck portion is formed, and the columnar single crystal 47 is grown from the silicon melt D. By repeating this process, it is possible to manufacture plural pieces of single crystal 47.

EXAMPLES

Hereinafter, the effects of the present invention are verified with reference to Examples and Comparative Examples of the present invention.

Examples 1 to 4 and Comparative Examples 1 to 4

By appropriately using natural silica glass powder as an outer layer material and plural types of synthetic silica glass powder having different silanol concentrations as an inner layer material, silica glass powder was deposited on the inner surface of a carbon mold and melted by arc discharge, thereby manufacturing vitreous silica crucibles (an aperture diameter: 32 inches) having the OH group concentrations shown in Table 1. In Table 1, "layer thickness/thickness" indicates a ratio of the thickness of the erosion thickness portion in which the concentration of an OH group is adjusted to the thickness of the crucible. The concentration of an OH group in Table 1 is a value measured by IR spectroscopy from the inner surface of the crucible in the range of the layer thickness.

Next, the vitreous silica crucibles were set in a single crystal pulling device shown in FIG. 3, and with the supplement of raw polycrystal silicon after the completion of pulling-up, 3 pieces of single-crystal silicon having a diameter of 300 mm were manufactured. This result is shown in Table 1. In Examples 1 to 4 of the present invention, the single-crystal silicon yield was 80% or more. In contrast, in Comparative Examples 1 to 4 in which the concentration of an OH group of the inner surface of the crucible is not adjusted, since the brown rings or spots generated in the inner surface of the crucible during the pulling-up of the single-crystal silicon were peeled and mixed into the silicon melt B so as to prevent the growth of the single-crystal silicon, the single-crystal silicon yield was remarkably decreased.

TABLE 1

|  | OH group concentration (ppm) | | | Layer thickness/thickness | Single-crystal silicon yield | Special note |
|---|---|---|---|---|---|---|
|  | Wall portion | Curved portion | Bottom |  |  |  |
| Example 1 | 148 | 134 | 90 | 10% | 89% | No peeling |
| Example 2 | 100 | 80 | 60 | 12% | 80% | No peeling |
| Example 3 | 120 | 100 | 80 | 5% | 82% | No peeling |
| Example 4 | 150 | 90 | 70 | 6% | 84% | No peeling |
| Comparative Example1 | 200 | 160 | 140 | 12% | 21% | BR and spot are partially peeled |
| Comparative Example2 | 40 | 30 | 30 | 12% | 17% | BR and spot are partially peeled |
| Comparative Example3 | 200 | 160 | 140 | 3% | 26% | BR and spot are partially peeled |
| Comparative Example4 | 40 | 30 | 30 | 20% | 21% | BR and spot are partially peeled |

Note:
BR denotes the brown ring and spot denotes the spot of the inner surface of the crucible While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

What is claimed is:

1. A vitreous silica crucible for pulling single-crystal silicon, which is formed of vitreous silica and has a bottomed cylindrical shape, wherein, with respect to the concentration of an OH group included in a vitreous silica layer of an inner surface of the crucible being made of a synthetic fused silica powder in which the concentration of an OH group is adjusted:
    the OH group concentration in a portion from a lower end of a straight barrel portion to a bottom of the crucible is higher than that in the bottom of the crucible, and
    the OH group concentration in the straight barrel portion of the crucible is higher than that in the portion from the lower end of the straight barrel portion to the bottom portion of the crucible.

2. The vitreous silica crucible according to claim 1, wherein the concentration of an OH group included in the vitreous silica layer of the inner surface of the crucible, being made of the synthetic fused silica powder in which the concentration of an OH group is adjusted is 40 to 120 ppm in the bottom of the crucible, is 50 to 140 ppm in the portion from the lower end of a straight barrel portion to a bottom portion of the crucible and is 60 to 150 ppm in the straight barrel portion of the crucible;
    the concentration of an OH group in the portion from the lower end of the straight barrel portion to the bottom of the crucible is higher than that in the bottom of the crucible by 10 to 50 ppm, and the concentration of an OH group in the straight barrel portion of the crucible is higher than that in the portion from the lower end of the straight barrel portion to the bottom of the crucible by 10 to 30 ppm; and
    the thickness of the vitreous silica layer made of the synthetic fused silica powder in which the concentration of an OH group is adjusted is 15% or less of the thickness of the crucible of a portion corresponding thereto.

3. The vitreous silica crucible according to claim 1, wherein the vitreous silica layer of the inner surface of the crucible, being made of the synthetic fused silica powder in which the concentration of an OH group is adjusted is a transparent layer portion having a thickness of 1 mm from the inner surface of the crucible.

4. A method of pulling single-crystal silicon, comprising the steps of:
    filling a silicon melt in the vitreous silica crucible according to claim 1 and adjusting a liquid level of the silicon melt to an upper side of the liquid-level movement range;
    growing single-crystal silicon from the silicon melt by immersing silicon seed crystal in the silicon melt and pulling the silicon seed crystal, followed by moving the liquid level of the silicon melt to a lower side of the liquid-level movement range; and
    adding new silicon to the silicon melt so as to re-adjust the liquid level of the silicon melt to the upper side of the liquid-level movement range and growing new single-crystal silicon melt.

5. The vitreous silica crucible according to claim 1, wherein the concentration of an OH group included the vitreous silica layer of the inner surface of the crucible, being made of the synthetic fused silica powder in which the concentration of an OH group is adjusted is 40 to 120 ppm in the bottom of the crucible, is 50 to 140 ppm in the portion from the lower end of a straight barrel portion to a bottom portion of the crucible and is 60 to 150 ppm in the straight barrel portion of the crucible;
    the concentration of an OH group in the portion from the lower end of the straight barrel portion to the bottom of the crucible is higher than that in the bottom of the crucible by 10 to 50 ppm, and the concentration of an OH group in the straight barrel portion of the crucible is higher than that in the portion from the lower end of the straight barrel portion to the bottom of the crucible by 10 to 30 ppm; and
    the thickness of the vitreous silica layer made of the synthetic fused silica powder in which the concentration of an OH group is adjusted is 15% or less of the thickness of the crucible of a portion corresponding thereto.

* * * * *